United States Patent [19]
Fernando et al.

[11] Patent Number: 6,134,742
[45] Date of Patent: *Oct. 24, 2000

[54] APPARATUS FOR PARTICLE REDUCTION IN SEMICONDUCTOR PROCESSING EQUIPMENT

[75] Inventors: Cesar R. Fernando; Narendra Patel, both of San Jose, Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/048,064

[22] Filed: Mar. 26, 1998

[51] Int. Cl.[7] ................................................. A47L 13/46
[52] U.S. Cl. ............................................. 15/231; 15/210.1
[58] Field of Search ................................. 15/209.1, 210.1, 15/231

[56] References Cited

U.S. PATENT DOCUMENTS

| | | | |
|---|---|---|---|
| 825,400 | 7/1906 | Lightbrown | 15/231 |
| 1,918,101 | 7/1933 | Henriquez | 15/209.1 |
| 3,571,837 | 3/1971 | Weaver | 15/231 |
| 4,709,655 | 12/1987 | Van Mastrigt . | |
| 5,268,034 | 12/1993 | Vukelic . | |
| 5,271,995 | 12/1993 | Paley et al. | 15/210.1 |
| 5,320,900 | 6/1994 | Oathout | 15/210.1 |
| 5,516,732 | 5/1996 | Flegal . | |
| 5,607,515 | 3/1997 | Takahashi . | |
| 5,679,405 | 10/1997 | Thomas et al. . | |
| 5,809,607 | 9/1998 | Elson et al. | 15/210.1 |

*Primary Examiner*—Terrence R. Till

[57] ABSTRACT

A cleaning handle is used to clean semiconductor processing equipment to reduce particles. A relatively thin handle is formed for insertion into difficult to reach areas and includes slots for affixing a cleaning wipe. The wipe is fed through the slots and wrapped around the handle to secure the wipe for cleaning the equipment, while preventing damage to the equipment. The wipe may be moistened with a cleaning agent to further enhance the cleaning ability of the handle.

11 Claims, 5 Drawing Sheets

APPARATUS FOR PARTICLE REDUCTION IN SEMICONDUCTOR PROCESSING EQUIPMENT

TECHNICAL FIELD

The present invention relates to a cleaning apparatus and a method of using the apparatus to reduce particles in semiconductor processing equipment. The present invention is particularly applicable in reducing particles in chemical vapor deposition equipment.

BACKGROUND ART

Current semiconductor manufacturing methodology requires "clean" processing environments that are relatively free of particle contamination. Generally, all semiconductor manufacturing steps are performed in a clean room in which the air is continuously filtered to remove particles. Unwanted particles introduced onto wafers can cause improperly defined features, undesirable surface topography, leakage through various insulating layers and other problems affecting circuit reliability. In a worst case scenario, particles introduced into the manufacturing environment can result in an unusable product causing the loss of considerable manufacturing time and costs.

During certain steps in the manufacturing process, the elimination of particles is more critical to producing a reliable product. For example, eliminating particles during chemical vapor deposition (CVD) process steps is critical to producing a reliable product. CVD equipment typically includes a loadlock chamber for loading wafers to be processed.

The loadlock chamber is connected to a process chamber where various chemical films are deposited onto the surface of the wafers. If the number of particles introduced into the process at this step is too high, the wafers may be rendered unusable.

Extreme care is typically taken to avoid the introduction of contaminants into the CVD process chamber. For example, complex cleaning routines, such as those disclosed in U.S. Pat. No. 5,607,515, are conventionally used to ensure that the number of particles in the process chamber are kept to a minimum.

A drawback with these conventional cleaning procedures is that they are time consuming and costly in a manufacturing environment. Another drawback with such procedures is that only the process chamber is cleaned, with no attention given to the loadlock chamber.

More particularly, conventional CVD loadlock chambers often include a cooling station for cooling the wafers after the chemical deposition in the process chamber. The cooling station typically contains areas that are relatively inaccessible to the human hand.

The loadlock chamber is not typically considered a major source of contaminants because it is not directly involved in the chemical deposition. In addition, the inaccessible parts of the equipment are generally not cleaned due to the belief that these parts are relatively immune from outside contamination. Therefore, the inaccessible parts of the loadlock cooling station are not cleaned to the degree required to reduce particles.

SUMMARY OF THE INVENTION

There exists a need for a device for cleaning semiconductor equipment in an efficient, cost-effective manner.

There is also a need for a method for cleaning semiconductor equipment in an efficient, cost-effective manner.

These and other needs are met by the present invention, where a cleaning device is used for cleaning semiconductor processing equipment. The cleaning device includes a handle containing slots to secure a cleaning wipe for cleaning the semiconductor equipment. In certain embodiments, the cleaning device is configured for insertion into areas that are difficult to clean.

According to one aspect of the invention, a device for cleaning semiconductor processing equipment is provided. The device includes a handle having a first end and a second end. The device also includes a plurality of slots located on the first end of the handle The plurality of slots are configured for affixing a cleaning wipe to the handle.

Another aspect of the present invention provides a method for cleaning a semiconductor processing device using a cleaning handle having a first end and a second end. The method includes affixing a cleaning wipe to the first end of the handle. The method also includes wrapping the cleaning wipe around the first end of the handle and wiping the semiconductor processing device.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF ILLUSTRATED EMBODIMENTS

The present invention will be described in conjunction with its use in cleaning conventional chemical vapor deposition (CVD) equipment, such as CVD equipment employing a cooling station. A brief description will first be given of an exemplary CVD device, followed by the detailed description of the invention. It will become apparent, however, that the present invention is also applicable for use with other semiconductor processing devices, as described in detail below.

Chemical Vapor Deposition Equipment

Chemical vapor deposition (CVD) is a gas reaction process commonly used to form thin layers of materials over an integrated circuit substrate. For example, silicon oxide, silicon nitride and polysilicon are typically deposited on semiconductor substrates during various manufacturing processes.

Figure 1:
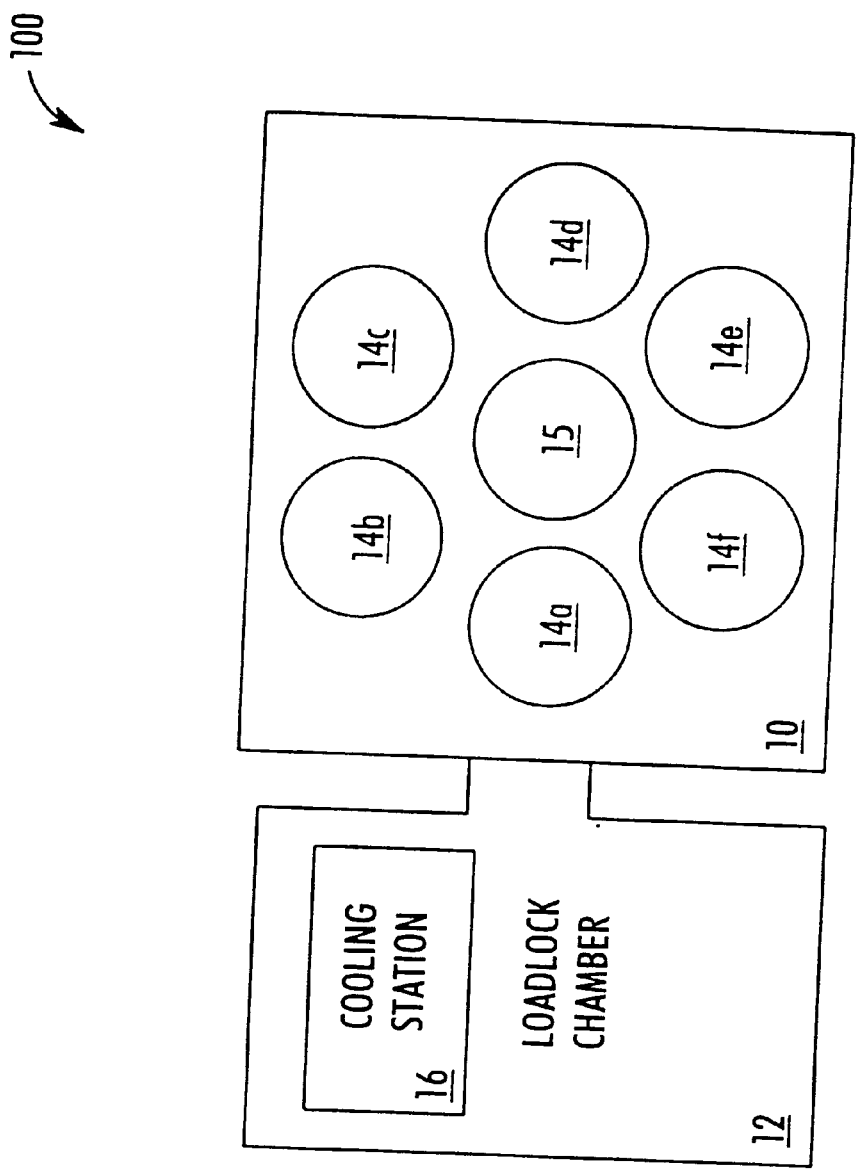
FIG. 1 schematically illustrates a conventional CVD device including a cooling station.

FIG. 1 illustrates an exemplary CVD device in which the present invention may be advantageously employed. CVD device 100 is a conventional CVD processing device, e.g., a Novellus Concept One or Concept Two device, by NOVELLUS SYSETMS®, Inc., San Jose, Calif. CVD device 100 comprises two main components, process chamber 10 and loadlock chamber 12. Process chamber 10 comprises five wafer processing stations, 14b–f, and a load/unload station 14a for loading and unloading wafers into process chamber 10. The particular number of processing stations varies depending on the particular CVD device. Process chamber 10 also includes wafer transport device 15 for moving wafers between stations 14a–f.

Figure 2A:
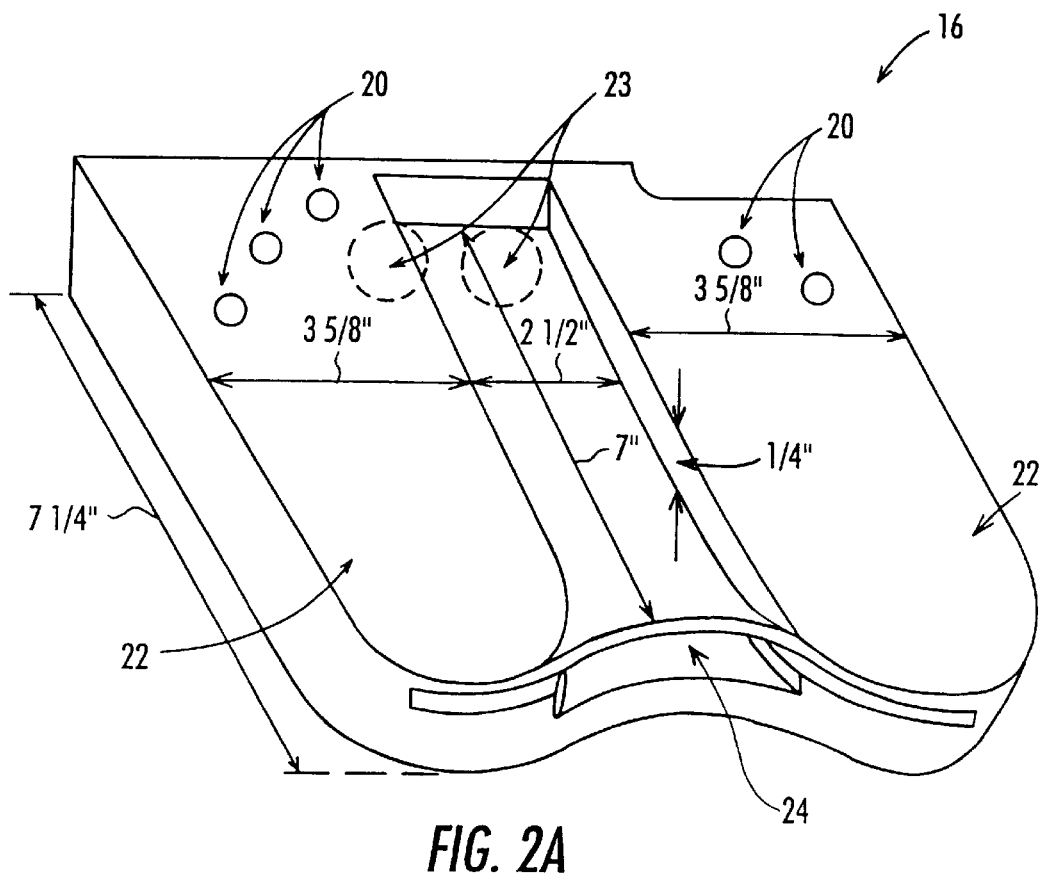
FIG. 2A illustrates the cooling station of the CVD device of FIG. 1.

Process chamber 10 is coupled to a loadlock chamber 12 for introducing wafers into and removing wafers from process chamber 10. Loadlock chamber 12 includes wafer cooling station 16 for receiving processed wafers from process chamber 10. FIG. 2A illustrates a cooling station 16 for a Novellus Concept One or Concept Two System, by NOVELLUS SYSETMS®, Inc. FIG. 2A is not drawn to scale and the exemplary dimensions shown are approximations.

Referring to FIG. 2A, cooling station 16 functions to cool wafers after removal from process chamber 10. Cooling station 16 includes pins 20, located on surfaces 22, for preventing processed wafers from sliding to the end of cooling station 16. Cooling station 16 also includes connections 23 for water input/output, used to cool processed wafers.

In exemplary cooling station 16, processed wafers from process chamber 10 are cooled in two stages. A robot arm places the wafers in sequence from process chamber 10 to surfaces 22, i.e., the first stage, for a first wafer and also second stage 24 for a second wafer. The wafers, after being cooled, are transferred to cassettes.

Figure 2B:
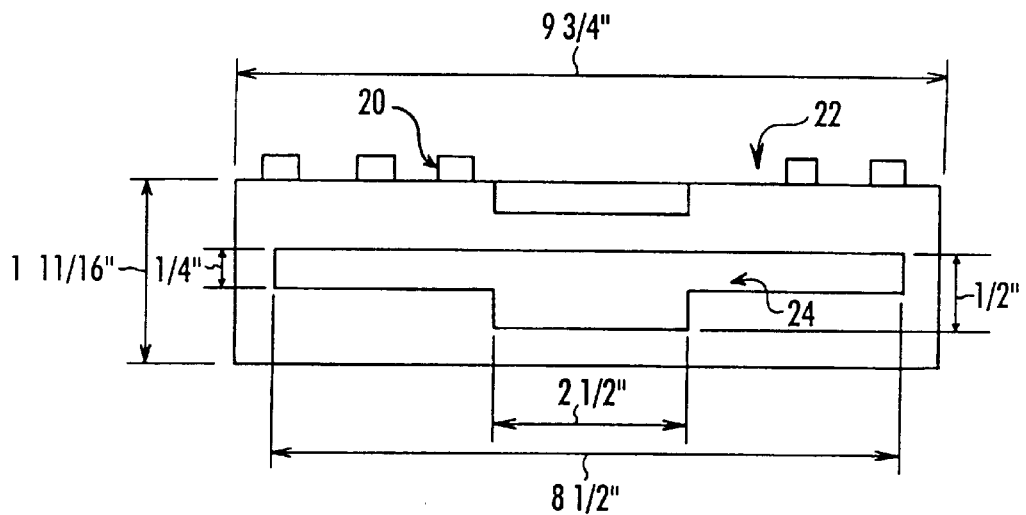
FIG. 2B is a front view of the cooling station of FIG. 2A.

FIG. 2B illustrates the front view of cooling station 16. Second stage 24 includes an opening for receiving the wafers from process chamber 10. In the exemplary CVD device, the opening is approximately ½" high and 2½" wide in the center of cooling station 16. The opening narrows to approximately ¼" high beneath surfaces 22 and proceeds approximately the entire length of cooling station 16, i.e., about 7". While cooling in second stage 24, processed wafers remain susceptible to contaminants. These contaminants may be introduced from outside CVD device 100, from process chamber 10 or from loadlock chamber 12 itself. Further, since cooling station 16 is accessible to process chamber 10, contaminants from process chamber 10 can be introduced into cooling station 16.

As discussed previously, contaminants must be kept to a minimum to ensure reliable products and a high manufacturing yield. However, conventional cleaning procedures are generally time-consuming and costly in a manufacturing environment and ignore the cooling station as a source of contaminants. For example, the loadlock station can be wiped by hand to reduce visible particle build-up. However, many parts of cooling station 16 are virtually inaccessible to both the hand and the eye, e.g., second stage 24 of cooling station 16. Further, it has been found that during wafer processing, pressure differences and gas purges between loadlock chamber 12 and process chamber 10 result in particles collecting on virtually all parts of loadlock chamber 12. Accordingly, as discussed previously, an efficient, cost-effective device and method are needed for cleaning the cooling station.

Cleaning Handle and Method of Cleaning

The present invention addresses and solves the problems associated with cleaning semiconductor equipment, thereby reducing particle contamination in an efficient, cost-effective manner. In accordance with one embodiment of the present invention, a relatively thin handle is used to clean semiconductor processing equipment. The handle includes a first end that is capable of receiving a cleaning wipe for cleaning the equipment. The cleaning wipe is then wrapped around the first end to facilitate cleaning, while avoiding damage to the equipment.

Figure 3:
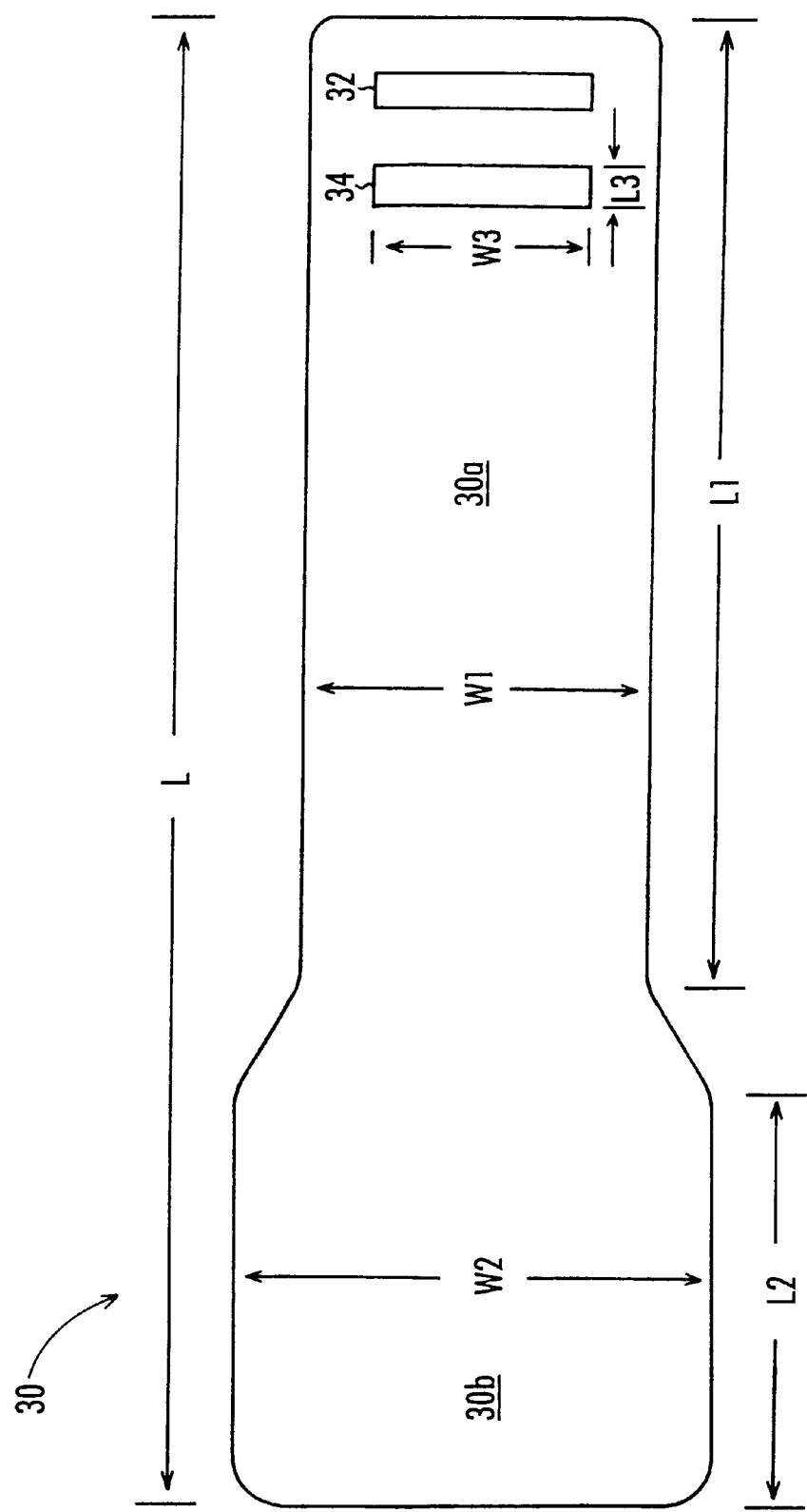
FIG. 3 illustrates a cleaning device according to an embodiment of the present invention.

An embodiment of the present invention is illustrated in FIG. 3, wherein cleaning handle 30 is formed from a material, e.g., a plastic material such as polypropylene or polyvinylidene. Alternatively, other non-plastic materials suitable for forming relatively thin, sturdy structures can be used to form handle 30.

In the exemplary embodiment, handle 30 is fabricated to optimize particle reduction in a Novellus Systems® Concept One or Concept Two CVD device. Accordingly, the sizes and parameters given herein are optimized for use with the exemplary CVD device. However, given the guidance and objectives disclosed herein, the particular dimensions of various handle parameters, as well as other handle parameters, e.g., handle material, can be readily optimized based on the particular device to achieve maximum particle reduction.

Referring to FIG. 3, handle 30 has an overall length L and includes tapered end 30a having a length L1 and width W1. In the exemplary embodiment, L is approximately 12", L1 is approximately 8" and W1 is approximately 1¾". These dimensions facilitate insertion of handle 30 into second stage 24 of cooling station 16 and enable handle 30 to easily reach all parts of second stage 24.

Handle 30 also includes end 30b having a length L2 and width W2. In the exemplary embodiment, L2 is approximately 3" and W2 is approximately 2½". Handle end 30b is used by an operator to hold handle 30 and perform the cleaning procedures. In the exemplary embodiment, ends 30a and 30b are substantially coplanar. However, in alternative embodiments, ends 30a and 30b can be offset from each other, i.e., not coplanar.

Handle 30 is relatively thin to facilitate cleaning in spaces with narrow clearances. For example, it has been found suitable to form handle 30 having a thickness of about 1/16" to about 1/8". More particularly, it has been found suitable to employ handle 30 formed from approximately 1/16" thick polyvinylidene. Alternatively, it has been found suitable to employ handle 30 formed from approximately 1/8" thick polypropylene. Advantageously, the plastic materials provide sturdy and flexible structures that facilitate cleaning. However, other materials, e.g., an anti-static material, at various thicknesses can also be employed to form cleaning handle 30, based on the particular requirements.

Cleaning handle 30 includes two slots 32 and 34, having a length L3 and width W3, located at tapered end 30a. In the exemplary embodiment, slots 32 and 34 are arranged substantially parallel to each other and transverse to the longitudinal axis of handle 30. However, in alternative embodiments, slots 32 and 34 can be arranged substantially parallel to the longitudinal axis of handle 30. Slots 32 and 34 function to secure a cleaning wipe (not shown) to handle 30, thereby ensuring that the cleaning wipe does not come loose from handle 30 during cleaning steps and get lodged in second stage 24 of cooling station 16. The sizes and locations of slots 32 and 34 are optimized for securing a cleaning wipe based on the particular equipment.

For example, in the exemplary embodiment, L3 is approximately ¼" and W3 is approximately 1¼" with slots 32 and 34 being located approximately ½" apart. Additionally, in the exemplary embodiment, slot 32 is located approximately ⅜" from the end of 30a opposite 30b.

Figure 4:
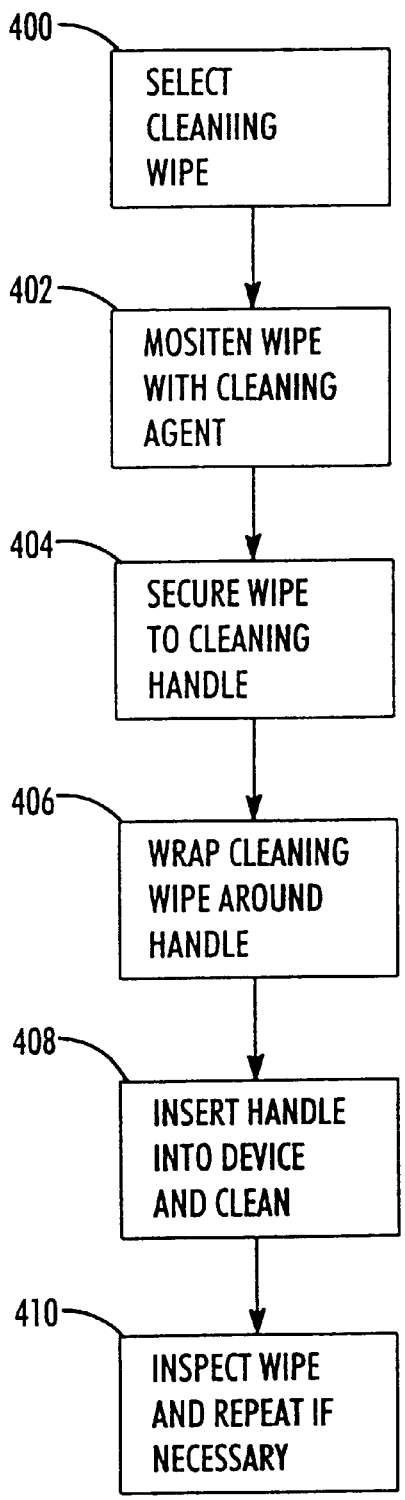
FIG. 4 is a flow diagram illustrating a method of using the cleaning device of FIG. 3.

Handle 30 can be used in combination with any standard wipe conventionally used to clean semiconductor processing equipment. For example, a particle-free, polyester/cotton wipe can be used with handle 30. Advantageously, using a particle-free wipe ensures that the cleaning procedure itself introduces no particles into the semiconductor processing equipment. Alternatively, any other wipe of suitable size and material can be used with handle 30. FIG. 4 is a flow diagram illustrating the method for cleaning cooling station 16 using cleaning handle 30.

Referring to FIG. 4 at step 400, a cleaning wipe is selected. As discussed previously, the particular wipe selected is based on the equipment to be cleaned and handle 30 size. In the exemplary embodiment, the cleaning wipe is a 9"×9" particle-free wipe conventionally used for cleaning semiconductor equipment. Next, at step 402, the wipe is moistened with a cleaning agent, e.g., isopropyl alcohol. The cleaning agent enhances cleaning of cooling station 16, as compared to using a dry wipe.

Figure 3A:
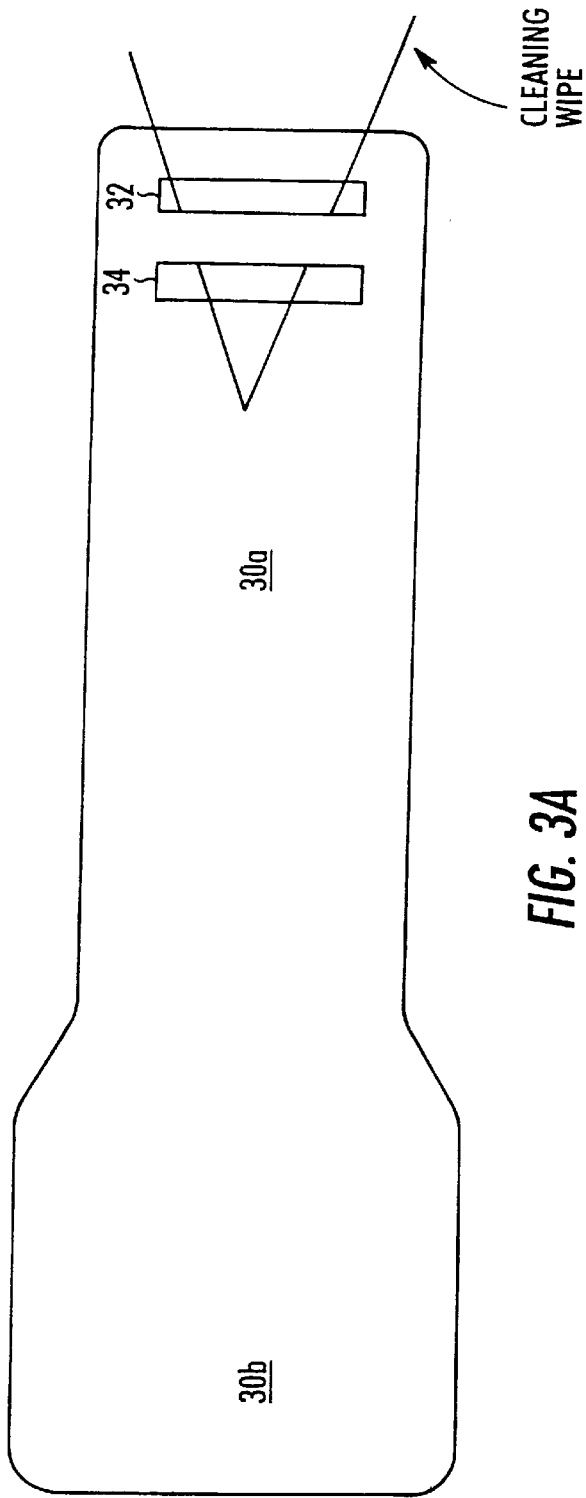
FIGS. 3A and 3B illustrate the cleaning device of FIG. 3 with a cleaning wipe secured according to an embodiment of the present invention.
Figure 3B:
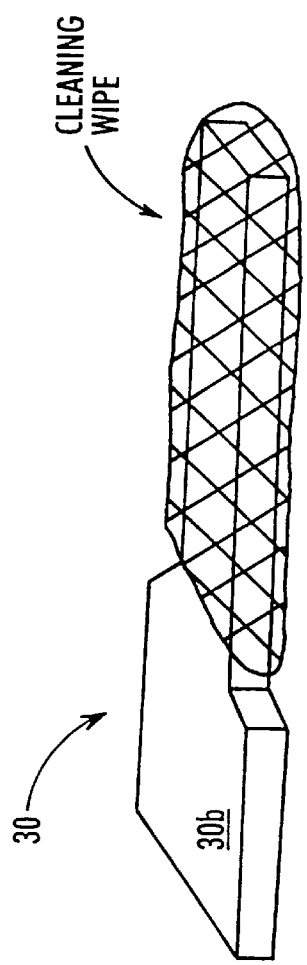

At step 404, one corner of the wipe is fed through slot 32 and the same corner of the wipe is fed up through slot 34, as illustrated in FIG. 3A. Approximately two inches of the wipe material is left loose after feeding through slot 34, to facilitate securing the wipe and ensuring that the wipe does not come loose from handle 30 and get lodged in the CVD device during subsequent cleaning steps. Next, at step 406, the remaining wipe material is wrapped around tapered end 30a, as illustrated in FIG. 3B, to facilitate cleaning the entire length of second stage 24 of cooling station 16 in an efficient manner. Advantageously, wrapping the wipe around tapered end 30a avoids damaging the CVD equipment.

Next, at step 408, the handle is gently inserted into second stage 24 of loadlock cooling station 16 until it stops. Grasping end 30b, handle 30 is then moved gently from side to side to clean second stage 24. At step 410, handle 30 is pulled out slowly and the wipe is examined. The dirty wipe is exchanged with a clean wipe and the procedure is repeated as necessary until visual inspection of the wipe indicates that cooling station 16 is clean.

Advantageously, it has been found that by using the present invention and inventive methodology, particle counts in CVD equipment can be significantly reduced. For example, total particle count after cleaning the exemplary CVD device using the present invention has been reduced to under 25, from above 40 using conventional cleaning technology or no cleaning for inaccessible second stage 24 of cooling station 16.

Described has been an apparatus and method for cleaning semiconductor processing equipment. An advantage of the invention is that it can easily be implemented and is both efficient and cost-effective in reducing particles in CVD equipment. Another advantage of the invention is that it is readily fabricated and customized to various semiconductor processing equipment.

In this disclosure, there is shown and described only certain preferred embodiments of the invention, but, as aforementioned, it is to be understood that the invention is capable of use in various other combinations and environments and is capable of changes or modifications within the scope of the inventive concept as expressed herein.

What is claimed is:

1. A device for cleaning semiconductor processing equipment, comprising:
   a handle comprising an anti-static material and having a first end and a second end; and
   a plurality of slots located on the first end of the handle, wherein the plurality of slots are configured for affixing a cleaning wipe to the handle.

2. The device of claim 1, wherein the plurality of slots are arranged transverse to the longitudinal axis of the handle.

3. The device of claim 2, wherein the plurality of slots is composed of two slots.

4. The device of claim 3, wherein the two slots are substantially parallel to each other.

5. The device of claim 1, wherein the first end of the handle is tapered with respect to the second end for insertion into semiconductor processing equipment.

6. The device of claim 1, wherein the handle is composed of a plastic material.

7. The device of claim 6, wherein the plastic material comprises polypropylene.

8. The device of claim 6, wherein the plastic material comprises polyvinylidene.

9. The device of claim 1, wherein the first end and the second end are substantially coplanar.

10. A device for cleaning semiconductor processing equipment, comprising:
    a handle having a first end and a second end; and
    a plurality of slots located on the first end of the handle, wherein the plurality of slots are configured for affixing a cleaning wipe to the handle and comprise two slots approximately 1¼"×¼".

11. A device for cleaning semiconductor processing equipment, comprising:
    a handle having thickness of about 1/16" to about ⅛" and comprising a first end and a second end; and
    a plurality of slots located on the first end of the handle, wherein the plurality of slots are configured for affixing a cleaning wipe to the handle.

* * * * *